(12) United States Patent
Bhattacharyya

(10) Patent No.: US 11,031,283 B2
(45) Date of Patent: Jun. 8, 2021

(54) TRENCH ISOLATION INTERFACES

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/675,464

(22) Filed: Nov. 6, 2019

(65) Prior Publication Data

US 2020/0075394 A1 Mar. 5, 2020

Related U.S. Application Data

(60) Continuation of application No. 16/396,288, filed on Apr. 26, 2019, now Pat. No. 10,483,155, which is a
(Continued)

(51) Int. Cl.
| | |
|---|---|
| *H01L 21/765* | (2006.01) |
| *H01L 27/11548* | (2017.01) |
| *H01L 29/40* | (2006.01) |
| *H01L 21/763* | (2006.01) |
| *H01L 21/762* | (2006.01) |
| *H01L 27/11575* | (2017.01) |

(Continued)

(52) U.S. Cl.
CPC .......... *H01L 21/765* (2013.01); *H01L 21/763* (2013.01); *H01L 21/76237* (2013.01); *H01L 27/11548* (2013.01); *H01L 27/11575* (2013.01); *H01L 29/402* (2013.01); *H01L 29/40117* (2019.08); *H01L 21/762* (2013.01); *H01L 27/115* (2013.01)

(58) Field of Classification Search
CPC ............ H01L 21/765; H01L 29/40117; H01L 21/76327; H01L 21/763; H01L 27/11548; H01L 27/11575; H01L 29/402; H01L 27/115
USPC .......... 257/66, 315, 374, 446; 438/201, 211, 438/221
See application file for complete search history.

(56) References Cited

U.S. PATENT DOCUMENTS

| | | |
|---|---|---|
| 4,870,470 A | 9/1989 | Bass et al. |
| 6,743,681 B2 | 6/2004 | Bhattacharyya |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Thinh T Nguyen
(74) *Attorney, Agent, or Firm* — Brooks, Cameron & Huebsch, PLLC

(57) ABSTRACT

The present disclosure includes semiconductor structures and methods of forming semiconductor structures for trench isolation interfaces. An example semiconductor structure includes a semiconductor substrate having a shallow trench isolation (STI) structure with a trench formed therein. A material in the trench forms a charged interface by interaction with the semiconductor substrate of the STI structure. The formed charged interface raises a parasitic threshold of the STI structure.

14 Claims, 2 Drawing Sheets

Related U.S. Application Data division of application No. 15/641,478, filed on Jul. 5, 2017, now Pat. No. 10,297,493.

(51) Int. Cl.
*H01L 21/28* (2006.01)
*H01L 27/115* (2017.01)

(56) References Cited

U.S. PATENT DOCUMENTS

| | | | |
|---|---|---|---|
| 6,743,682 B2 | 6/2004 | Woerlee et al. | |
| 6,888,200 B2 | 5/2005 | Bhattacharyya | |
| 6,903,969 B2 | 6/2005 | Bhattacharyya | |
| 6,917,078 B2 | 7/2005 | Bhattacharyya | |
| 6,998,667 B2 | 2/2006 | Bhattacharyya | |
| 7,012,297 B2 | 3/2006 | Bhattacharyya | |
| 7,042,027 B2 | 5/2006 | Bhattacharyya | |
| 7,130,216 B2 | 10/2006 | Bhattacharyya | |
| 7,145,186 B2 | 12/2006 | Bhattacharyya | |
| 7,158,410 B2 | 1/2007 | Bhattacharyya et al. | |
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2 | 12/2009 | Bhattacharyya | |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2 | 2/2012 | Bhattacharyya | |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 2003/0151948 A1 | 8/2003 | Bhattacharyya | |
| 2004/0016956 A1 | 1/2004 | Choi et al. | |
| 2007/0034922 A1 | 2/2007 | Bhattacharyya | |
| 2007/0045711 A1 | 3/2007 | Bhattacharyya | |
| 2007/0045718 A1 | 3/2007 | Bhattacharyya | |
| 2008/0303080 A1 | 12/2008 | Bhattacharyya | |
| 2009/0039416 A1 | 2/2009 | Lai et al. | |
| 2010/0090265 A1 | 4/2010 | Bhattacharyya et al. | |
| 2014/0315371 A1* | 10/2014 | Cai et al. | H01L 29/66795 438/274 |
| 2014/0357034 A1* | 12/2014 | Cheng et al. | H01l 21/823821 438/275 |
| 2015/0021702 A1* | 1/2015 | Liu et al. | H01L 29/0653 257/368 |
| 2015/0303249 A1* | 10/2015 | Bentley et al. | H01L 29/0649 257/622 |

OTHER PUBLICATIONS

Bhattacharyya et al., "Properties and Applications of Silicon Oxynitride Films", from IBM Technical Report TR. 19.0399, presented at the Electrochemical Society (ECS) 150th Meeting, Oct. 1976, Las Vegas, NV, 20 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

(56) References Cited

OTHER PUBLICATIONS

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 645-648.

Lue et al., "A Novel P-Channel NAND-type Flash Memory with 2 bit/cell Operation and High Programming Throughput (>20 Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p- MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al., Novel ZrO2/Si3N4 Dual Charge Storage Layer to Form Step-up Potential Wells for Highly Reliable Multi-level Cell Application, IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

* cited by examiner

TRENCH ISOLATION INTERFACES

PRIORITY INFORMATION

This application is a Continuation of U.S. application Ser. No. 16/396,288, filed Apr. 26, 2019, which is a Divisional of U.S. application Ser. No. 15/641,478, filed Jul. 5, 2017, and issued as U.S. Pat. No. 10,297,493 on May 21, 2019, the contents of which are included herein by reference.

TECHNICAL FIELD

The present disclosure relates generally to semiconductor devices and, more particularly, to trench isolation interfaces for use in memory, image, logic, and other semiconductor devices.

BACKGROUND

Implementing electronic circuits involves connecting separate devices or circuit components through specific electronic paths. In silicon integrated circuit (IC) fabrication, devices that are formed on or in a single substrate may be isolated from one another. The individual devices or circuit components may be subsequently interconnected to create a specific circuit configuration. As density of the devices continues to rise, and feature size shrinks below 50 nanometers (nm), parasitic inter-device capacitive coupling and fringing field induced leakage currents may become more problematic. Isolation technology, therefore, has become an important aspect of integrated circuit fabrication.

DETAILED DESCRIPTION

Figure 1A:
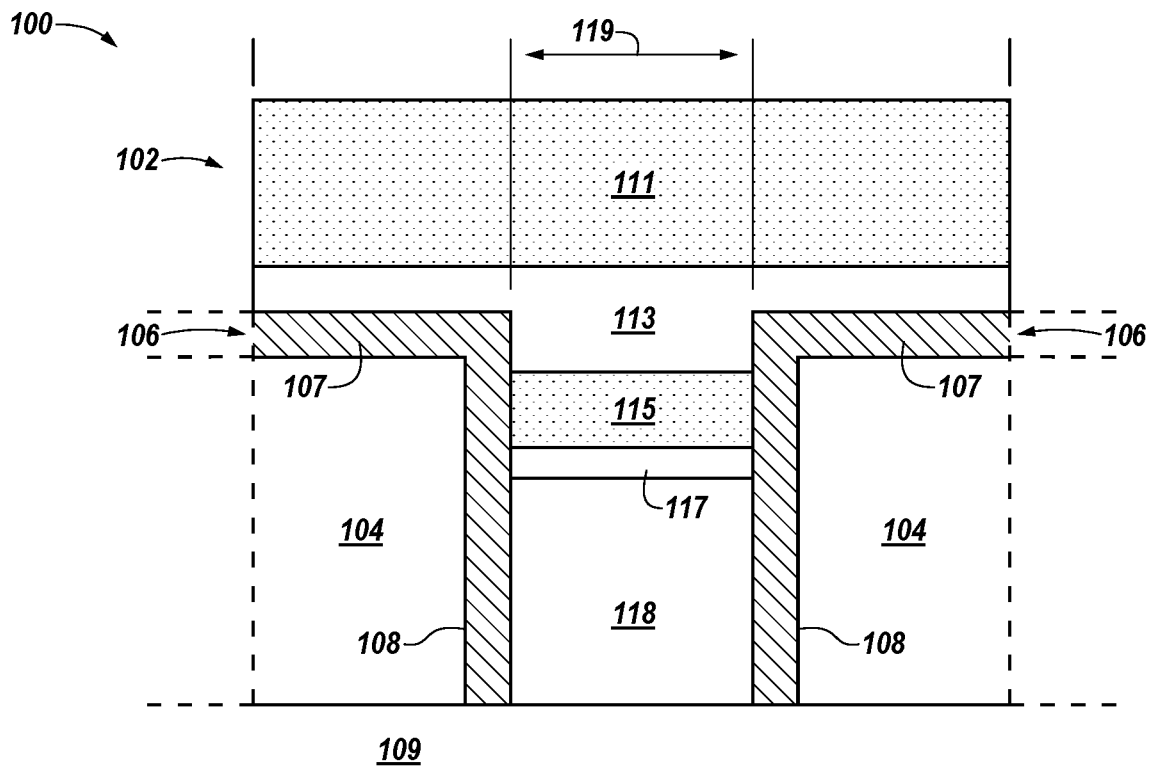
FIGS. 1A and 1B are cross-sectional views of a portion of embodiments of a trench isolation interface in accordance with a number of embodiments of the present disclosure.

Dynamic random access memory (DRAM) devices, for example, may include an array of memory cells for storing data and peripheral circuits for controlling data in the memory cells. Each memory cell in DRAM may store one bit of data and may consist of one transistor and one capacitor. Within the array, each memory cell may be electrically isolated from adjacent memory cells. The degree to which large numbers of memory cells can be integrated into a single IC chip may depend, among other things, on the degree of isolation between the memory cells. Similarly, in metal-oxide-semiconductor (MOS) technology, isolation may be provided between adjacent devices, such as negative channel MOS (NMOS) transistors or positive channel MOS (PMOS) transistors and/or complementary MOS (CMOS) circuits, to prevent parasitic channel formation. An NMOS transistor and a PMOS transistor may be field effect transistors (FET) that in combination form a portion of a MOSFET CMOS.

Shallow trench isolation (STI) is one technique that may be used to isolate memory devices, such as memory cells and/or transistors, from one another. For instance, STI formation may include formation of (e.g., etching) a trench into a substrate, such as a crystalline silicon substrate, for a semiconductor device (e.g., a semiconductor substrate). An oxide, for instance, a high density plasma oxide, may be deposited to fill the trench and may be heated to densify the deposited oxide.

However, as the density of the device rises and the length and/or width of an active region (e.g., between an NMOS transistor and a PMOS transistor in a CMOS-type circuit) decreases, an STI structure formed as just described may be insufficient to adequately reduce a parasitic effect, among other possible effects, that may adversely affect performance of the CMOS-type circuit and/or contribute to operational problems for the associated memory device. Certain key FET device parameters, such as the current-voltage characteristics and device transconductance, could be adversely affected, thereby degrading device specifications and associated functionality of memory arrays or logic circuits. Accordingly, improvement of trench isolation techniques may be desirable to address these and similar problems.

The present disclosure includes specific semiconductor structures and methods for trench isolation interfaces. An example of a semiconductor structure includes a semiconductor substrate having an STI structure with a trench formed therein. An additional material layer in the trench forms a charged interface whereby parasitic fringing fields are reduced (e.g., prevented or terminated) due to unipotential (metal-like) characteristics of the material. Another additional reactive dielectric material is deposited along the trench walls such that, by interaction with the semiconductor substrate of the STI structure, a high concentration of fixed negative charge is introduced. As a result, the parasitic threshold of the STI structure is sufficiently raised to reduce (e.g., eliminate) a possibility of a leakage path through the STI isolation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more", e.g., a number of memory arrays, can refer to one or more memory arrays, whereas a "plurality of" is intended to refer to more than one of such things. Furthermore, the words "can" and "may" are used throughout this application in a permissive sense, i.e., having the potential to, being able to, not in a mandatory sense, i.e., must. The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

"Substrate" as used herein is intended to mean a semiconductor substrate such as a base semiconductor layer or a semiconductor substrate having one or more layers, structures, or regions formed thereon. As such, a base semiconductor layer may be the lowest layer of silicon single crystal or silicon polycrystalline (polysilicon) material consisting of a silicon wafer or a silicon layer deposited on another material, such as silicon on sapphire. "Polysilicon" as used herein is intended to mean, in a number of embodiments, polysilicon that is doped (e.g., heavily doped n+ or p+ polysilicon), as appropriate to the context. For example, a polysilicon gate, as shown at 111 and described in connection with FIGS. 1A and 1B (e.g., a control gate, an access gate, etc.), may be formed from heavily doped polysilicon. "Layer" as used herein can refer to a layer formed on a substrate and/or a layer formed on a previously deposited layer using a number of deposition, processing, and thermal techniques, for example, as presented herein. The term "layer" is meant to include layers specific to the semiconductor industry, such as "barrier layer," "dielectric layer," and "conductive layer", among other types of layers. The term "layer" is intended to be synonymous with the term "film", as used in the semiconductor industry. The term "layer" may also include layers found in technology outside of semiconductor technology, such as coatings on glass.

The figures herein follow a numbering convention in which the first digit or digits correspond to the figure number and the remaining digits identify an element or component in the drawing. Similar elements or components between different figures may be identified by the use of similar digits. For example, 104 may reference element "04" in FIG. 1, and a similar element may be referenced as 204 in FIG. 2. Elements shown in the various embodiments herein can be added, exchanged, and/or eliminated so as to provide a number of additional embodiments of the present disclosure. In addition, the proportion and the relative scale of the elements provided in the figures are intended to illustrate certain embodiments of the present invention, and should not be taken in a limiting sense.

Figure 1B:
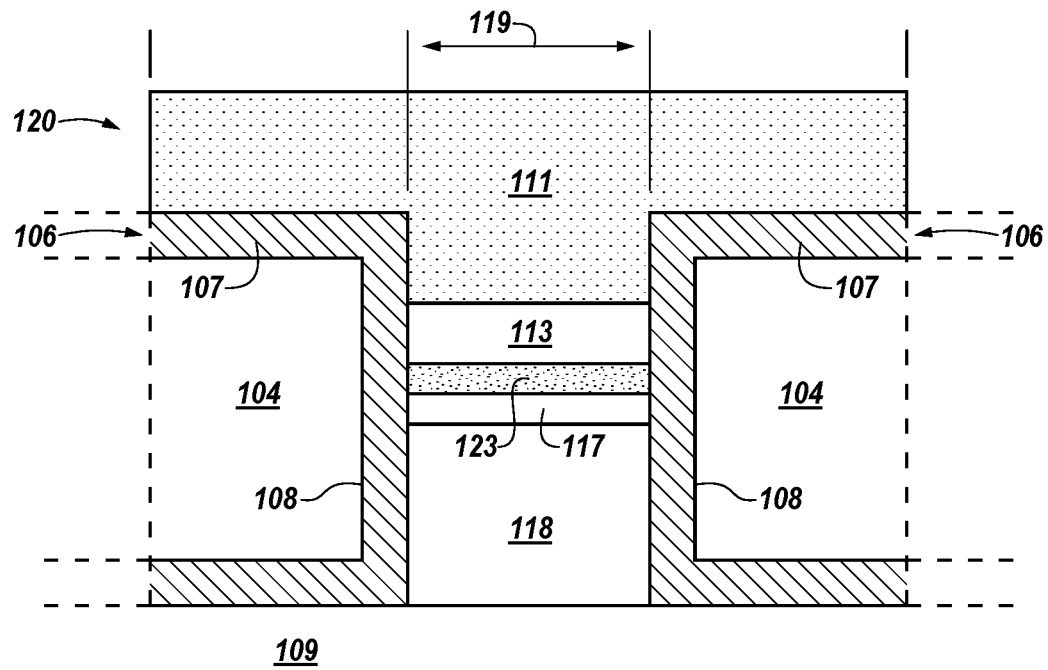

FIGS. 1A and 1B are cross-sectional views of a portion of embodiments of a trench isolation interface structure 100 in accordance with a number of embodiments of the present disclosure. The figures shown herein each illustrate only one memory device (e.g., memory cell) cross-section in an X-Z plane with a trench isolation structure (e.g., STI structures 104 or 204) across the X direction only. However, the semiconductor structures contemplated herein can have STI structures for a plurality of memory cells in both directions of the X-Z plane and a Y-Z plane.

In FIGS. 1A and 1B, the right and left edges of STI structure 104 are illustrated with an active non-volatile memory (NVM) cell, for example, cross-section in the middle between the right and left STI structure regions in a silicon substrate 109. After defining a trench 106 in the silicon substrate 109, a layer of aluminum oxide 107 (otherwise referred to as alumina or $Al_2O_3$) may be formed, e.g., deposited, in the trench 106 over the polysilicon of the STI structure 104. This may be followed by an appropriate anneal to create fixed negative charge at the interface 108 of the polysilicon and $Al_2O_3$ due to interaction, e.g., a chemical reaction, between the polysilicon and the $Al_2O_3$ resulting in formation of an aluminosilicate ($AlSiO_x$) at the interface 108. In a number of embodiments, a layer of silicon oxide ($SiO_2$) (not shown) may be deposited in the trench 106 over the polysilicon of the STI structure 104 prior to depositing the $Al_2O_3$ layer 107 thereon. Interaction between the $SiO_2$ and the $Al_2O_3$ dielectric materials also may result in formation of an $AlSiO_x$ at their interface.

Region 118 in FIG. 1A illustrates an extension of the silicon substrate 109 to a surface whereon an NVM stack structure may be fabricated thereafter. In FIGS. 1A and 1B, an $Al_2O_3$ collar (not shown) may be formed over the polysilicon of the STI structure 104 to extend beyond a polysilicon gate 111 (e.g., a control gate) of the active device. In the various STI structures described herein, a side-wall (not shown) of the polysilicon control gate 111 may merge with the STI structure 104 of the trench 106.

As shown in the embodiment of FIG. 1A, the polysilicon control gate 111 interfaces a high dielectric constant (k) dielectric blocking layer 113 of a silicon memory device 102 structure, which is extended on the top surface over the composite 104/107 isolation region (e.g., a combination of the polysilicon of the STI structure 104 and the $Al_2O_3$ layer 107) of the STI structure 104. Alternatively, in the embodiment shown in FIG. 1B, the blocking layer 113 of the silicon memory device 120 structure may be formed under the polysilicon control gate 111 and between opposite walls 119 of the trench 106 bordering the composite 104/107 isolation region of the STI structure 104.

Memory device 102, 120 stacked elements for an NVM device between the polysilicon control gate 111 and the silicon substrate 109, 118 may consist of three functional layers. As shown in FIG. 1A, the stacked elements include a tunnel layer 117, a trapping/charge storage layer 115, and the charge blocking layer 113. The corresponding tunnel layer is 117 and the corresponding trapping/storage layer is 123 in the memory cell of embodiment of FIG. 1B.

For clarity, the figures shown herein illustrate active areas within the context of surrounding STI isolation regions associated with various embodiments of an NVM cell formed on and/or within the semiconductor substrate 109. However, in a number of embodiments, the isolation schema described herein would be applicable to CMOS scaled NFET devices as well as n-channel NVM devices. This includes devices on any p-type substrate and/or devices fabricated over a number of p wells created on any n-type of substrate. The above isolation scheme also applies to n-channel FET technology built on other semiconductor substrates, including, but not limited to, Ge, SiGe, GaAs, InAs, InP, CdS, CdTe, other III/V compounds, and the like.

For CMOS scaled PFET devices and p-channel NVM devices, less stringent isolation techniques might be utilized. However, such devices may be fabricated either over an N-silicon substrate or within an N-well. In such devices, if implemented, a layer over the polysilicon of the STI structure 104 and/or an STI trench oxide (e.g., $SiO_2$, among other possible oxides), may be a thin insulator (e.g., dielectric) layer that interacts with the polysilicon of the STI structure 104 and/or the trench oxide to form an excess of fixed positive charge at the interface with the polysilicon of the STI structure 104 to form an insulator. Such an insulator may be selected from various metal-silicon borides, for example.

Memory devices (e.g., as shown at 102 in FIG. 1A, 120 in FIG. 1B, 232 in FIG. 2A, and 250 in FIG. 2B) may be organized in rows and columns in the form of memory array whereby a plurality (e.g., all) of memory devices may be isolated from each other by means of an STI structure (e.g., as shown at 104 in FIGS. 1A and 1B and at 204 in FIGS. 2A and 2B) having a respective trench isolation interface structure 100, 230. A particular type of STI schema compatible to a particular memory device type may be implemented to provide isolation for a plurality (e.g., all) of memory devices of the same type within a memory array. For example, in a number of embodiments, there may be one STI isolation schema, as shown and described in connection with FIGS. 1A and 1B, for the composite 104/107 isolation region for memory devices 102 and 120, respectively. Another STI isolation schema, as shown and described in connection with FIGS. 2A and 2B, may be used for memory devices 232 and 250, respectively, such as the composite 204/207/240 isolation region (e.g., including interface 208 shown for 204/207 and interface 239 shown for 207/240).

The isolation schema described herein also may be applicable to FET device types that utilize polysilicon as a gate material. Gates of FET devices or FET-based memory devices may either be heavily doped polysilicon gates (e.g., per gate 111 embodiments for memory devices 102 and 120 shown in FIGS. 1A and 1B) or metal gates (e.g., per gate 234 embodiments for memory devices 232 and 250 shown in FIGS. 2A and 2B). In the embodiments shown at 102 and 232, the respective control gates 111 and 234 (e.g., of a FET device or an NVM device) may be configured to overlap the STI structure 104/204 on each edge of the STI structure while remaining above an upper plane of the STI structure (e.g., not extending into and between the opposite walls 119, 219 of the trench 106, 206 bordering the isolation region of STI structures 104/204 formed from composites 104/107 and/or 204/207/240). In the embodiments shown at 120 and 250, the respective control gates 111 and 234 (e.g., of the FET device or the NVM device) may be configured to be partially contained inside and below the upper plane of the STI structure (e.g., extending into and between the opposite walls 119, 219 of the trench 106, 206 bordering the isolation region of STI structures 104/204 formed from composites 104/107 and/or 204/207/240).

Figure 2A:
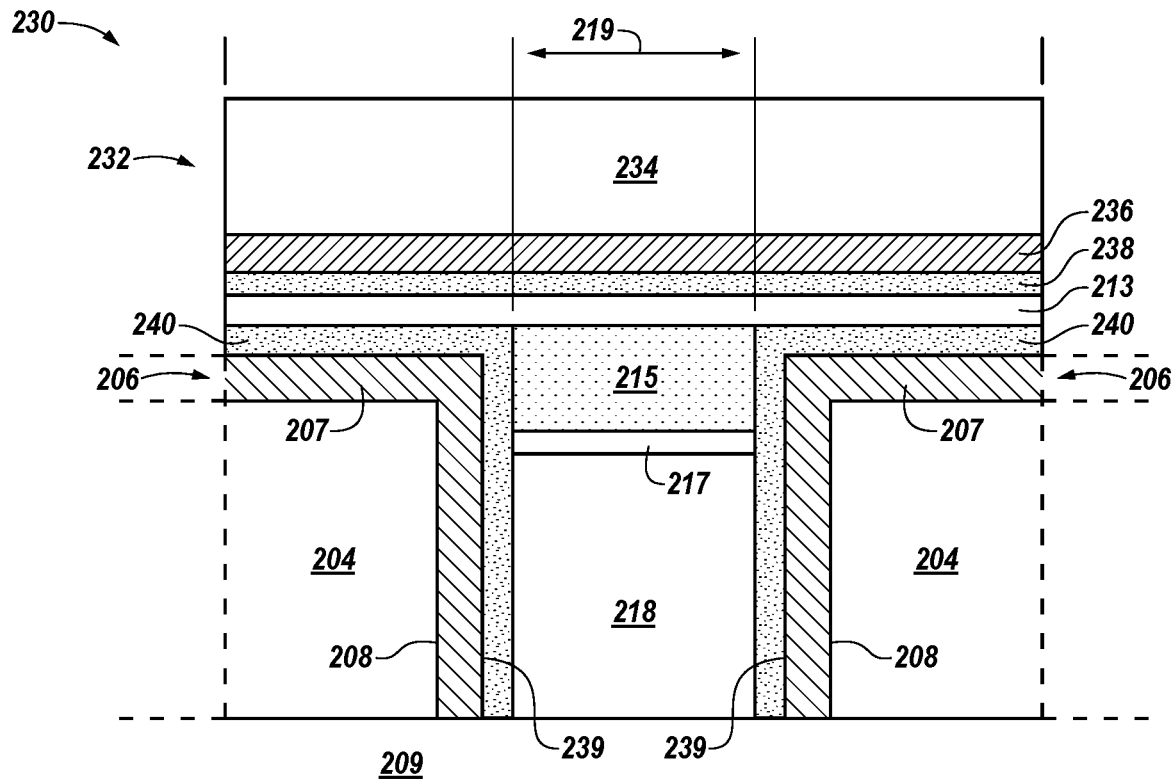
FIGS. 2A and 2B are cross-sectional views of a portion of embodiments of another trench isolation interface in accordance with a number of embodiments of the present disclosure.
Figure 2B:
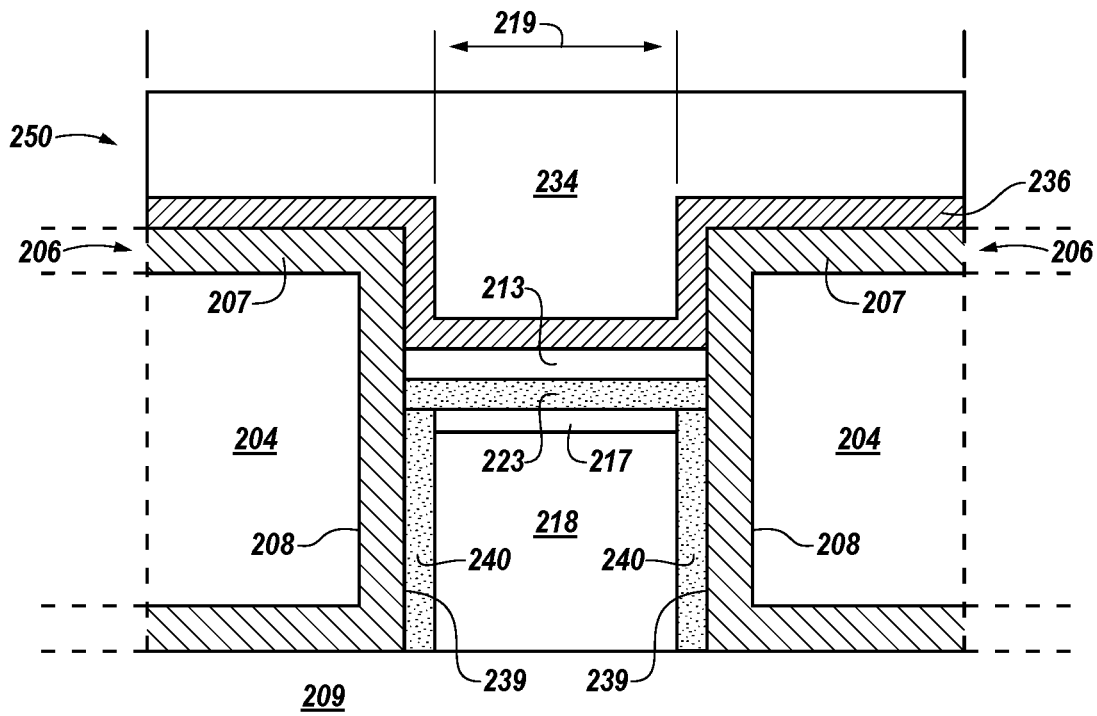

The parasitic edge fringing fields may be different depending upon whether the gates 111 and 234 are completely above the plane of the STI structure 104/204 (e.g., as shown for memory devices 102 and 232 in FIGS. 1A and 2A, respectively) in comparison to memory devices 120 and 250 having the gate at least partially below the top plane of the STI structure within the silicon substrate thereof (e.g., as shown in FIGS. 1B and 2B, respectively). In these embodiments, the fixed negative charge at the interface 108 of FIGS. 1A and 1B and the fixed negative charge at the interface 208 of FIGS. 2A and 2B is implemented to raise the parasitic threshold of the gate-overlapped STI regions and/or reduce the device leakage characteristics described herein. In the embodiments shown in FIGS. 2A and 2B, an additional "injector silicon-rich nitride" (IN-SRN) layer 240 is shown to be deposited over at least a portion of the aluminum oxide layer ($Al_2O_3$) 207 in the trench 206. The IN-SRN layer 240 is formed to contain silicon nanoparticles that are placed within direct tunneling distance from each other, thereby contributing to formation of a uni-potential dielectric material for the charged interface 208. The uni-potential dielectric material may reduce (e.g., prevent or terminate) parasitic fringing fields (e.g., due to edge geometry effects of the memory device design, among other possible causes). The modified STI structures 204 containing the composite 204/207/240 isolation region may reduce (e.g., prevent or terminate) the fringing field effects and/or the device leakage to enhance memory device characteristics (e.g., performance of FET devices and/or NVM devices).

The figures shown herein each illustrate only one trench isolation structure (e.g., STI structure 104 or 204), however, the semiconductor structures contemplated herein can have any number of STI structures. For example, in a number of embodiments, there may be one STI structure per memory device (e.g., STI structure 104 for memory devices 102 and/or 120 shown and described in connection with FIGS. 1A and 1B, respectively).

In a number of embodiments, the memory devices 102 and/or 120 shown and described in connection with FIGS. 1A and 1B and/or memory devices 232 and/or 250 shown and described in connection with FIGS. 2A and 2B may be, or may include at least one, FET-type transistor, as described herein (e.g., a number of NMOS transistors and/or PMOS transistors in a CMOS-type circuit). The memory devices 102, 120, 232 and/or 250 may be, or may include at least one, charge-trapping flash (CTF) memory device. In a number of embodiments, the memory devices 102, 120, 232 and/or 250 may be, or may include at least one, NAND and/or NOR non-volatile memory (NVM) device. Alternatively or in addition, the memory devices 102, 120, 232 and/or 250 may be, or may include at least one, nitride read-only memory (NROM) NVM device. Moreover, the memory devices 102, 120, 232 and/or 250 may be, or may include at least one, silicon-based unified memory (SUM) configured, in a number of embodiments, as volatile memory (VM) and/or NVM.

Each memory device 102, 120, 232 and/or 250 may be positioned interior to the STI structure 104 and/or 204 (e.g., as shown by double-headed arrows 119 in FIGS. 1A and 1B and 219 in FIGS. 2A and 2B). For example, each memory device may have at least a portion thereof (e.g., an active region involved in storage of and/or a compute operations performed on a data value) positioned interior to the STI structure (e.g., in a channel). As shown in FIGS. 1A and 1B, the memory devices 102 and/or 120 may be further positioned adjacent (e.g., contiguous) to the trench 106. Alternatively or in addition, an IN-SRN layer (e.g., as shown at 240 and described in connection with FIGS. 2A and 2B) may be formed on a surface of the trench 106 opposite from the interface 208 with the semiconductor substrate 209 and/or the STI structure 204. The memory devices 232 and/or 250 may be positioned adjacent (e.g., contiguous) to the IN-SRN layer 240.

Suitable techniques for forming and/or removing portions of the STI structure 104 (e.g., including the trenches thereof) on or from the semiconductor substrate 109 and/or the layers formed thereon may include etching techniques such as, but not limited to, reactive ion etching (ME), plasma etching, chemical dry etching, and/or ion beam etching, among other possible etching techniques.

The etch process may be allowed to continue to at least remove a portion of the STI structure 104 and/or the semiconductor substrate 109 in forming a trench 106. The depth that etching is performed into the STI structure 104 and/or the semiconductor substrate 109 to form the trench 106 may range from around 100 nanometers (nm) to around 800 nm. However, other depths may be implemented depending upon, for example, a desired aspect ratio (depth to width) of the opening into the STI structure 104 and/or the semiconductor substrate 109. Portions of the STI structure (e.g., a bottom portion of trench 106 adjacent the semiconductor substrate 109 in FIG. 1B and/or a bottom portion of trench 206 adjacent the semiconductor substrate 209 in FIG. 2B) may be etched prior to etching other portions of the STI structure 104 and/or the layers (e.g., to form the upper portions of trench 106 and/or trench 206.

The layers described herein in connection with FIGS. 1A and 1B and FIGS. 2A and 2B including, for example, an oxide (e.g., $SiO_2$) formed on the semiconductor substrate 109 used to form the STI structure 104 and the material 107 (e.g., $Al_2O_3$) and/or the IN-SRN layer 240 used to fill trench 106, may be deposited prior to and/or after forming (e.g., etching) a complete STI structure (e.g., including the trenches thereof). For example, some portions of the STI structure 104, 204 and/or the layers described herein positioned between portions of the STI structure (e.g., the portions of STI structure 104 associated with trench 106)

may be deposited on the semiconductor substrate 109, 209 prior to etching the STI structure and/or the layers to form the trenches and/or the channel interior to (e.g., between) the portions of the STI structure 104, 204 (e.g., as shown by double-headed arrows 119 in FIGS. 1A and 1B and 219 in FIGS. 2A and 2B). In a number of embodiments, the STI structure 104, 204 may be formed from the same material as the semiconductor substrate 109, 209 (e.g., polysilicon).

In a number of embodiments, some portions and/or layers of the memory devices 102, 120, 232 and/or 250 may be formed (e.g., deposited) interior to (e.g., between) the portions of the STI structure 104, 204 (e.g., in the channel). For example, a tunnel layer (e.g., as shown at 117 in FIGS. 1A and 1B and at 217 in FIGS. 2A and 2B) may be formed interior to the portions of the STI structure 104, 204.

In a number of embodiments, some portions and/or layers of the memory devices 102, 120, 232 and/or 250 may be formed (e.g., deposited) exterior to the STI structure. For example, a gate (e.g., a control gate, an access gate, etc.) as shown at 111 in FIGS. 1A and 1B and at 234 in FIGS. 2A and 2B may be formed exterior to the portions of the STI structure 104, 204. In a number of embodiments, the gate may be formed (e.g., deposited) as a layer after other layers of the memory device have been formed. Such a gate may be positioned on top of a channel of a corresponding memory device that is interior to the portions of the STI structure 104, 204. Such a gate may have a length and/or width that extends beyond the channel interior to the STI structure 104, 204 (e.g., as shown by extending to the outer lines associated with the double-headed arrows 119 in FIGS. 1A and 1B and 219 in FIGS. 2A and 2B). In a number of embodiments, the gate may extend above a horizontal portion of a trench (e.g., upper portion of trench 106 filled with material 107 shown in FIGS. 1A and 1B) for the length and/or width above the STI structure 104, 204.

The layers described herein in connection with FIGS. 1A and 1B and FIGS. 2A and 2B (e.g., including the oxide and/or the material 107 and/or the IN-SRN layer 240 used to fill trench 106) may be deposited utilizing a number of deposition techniques. A particular deposition technique may be selected based upon, for example, suitability of the deposition technique in connection with a particular chemical composition of the layer to be deposited, a thickness, length, and/or width of the layer to be deposited, whether the layer is to be deposited on a horizontal, vertical, and/or slanted surface, and/or a chemical composition of an underlying layer upon which the layer is to be deposited, among other possible considerations. The particular deposition technique may be selected from a group of such techniques that includes, but is not limited to, chemical vapor deposition (CVD), low pressure CVD (LPCVD), plasma enhanced CVD (PECVD), plasma vapor deposition (PVD), and atomic layer deposition (ALD), among other possible deposition techniques. For a number of embodiments described herein, oxidation and/or nitridation techniques may be performed in association with (e.g., before, during, and/or after) the particular deposition technique. Appropriate annealing techniques also may be performed.

FIGS. 1A and 1B each illustrate a cross-sectional view of a portion of an embodiment of a trench isolation interface structure 100 formed as a semiconductor structure. The semiconductor structure may, in a number of embodiments, include a polysilicon substrate (e.g., formed from the same material as polysilicon substrate 109) having an STI structure 104 with a trench 106 formed therein. In a number of embodiments, an oxide (not shown) formed on the surface of the STI structure 104 may be a $SiO_2$ dielectric layer (not shown). A material 107 used to fill the trench 106 may be an $Al_2O_3$ dielectric layer that forms a trench isolation interface 108 in the trench 106 with a fixed negative charge. The trench isolation interface 108 may be formed by interaction of the $Al_2O_3$ dielectric layer 107 with the $SiO_2$ dielectric layer on the STI structure 104 and/or with the polysilicon of the STI structure 104 itself. In a number of embodiments, the $Al_2O_3$ dielectric layer 107 may be formed on a surface of the $SiO_2$ dielectric layer opposite from the STI structure 104.

Alternatively, the $Al_2O_3$ dielectric layer 107 may be formed between a surface of the STI structure 104 and the $SiO_2$ dielectric layer. In a number of embodiments, a memory device (e.g., memory device 102 in FIG. 1A and/or memory device 120 in FIG. 1B) may be included in the semiconductor structure. As described herein, the memory device 102, 120 may have a portion positioned interior to the STI structure 104 and adjacent the trench 106.

The material 107 in the trench 106 may form a charged interface 108 by interaction with the polysilicon of the STI structure 104 (e.g., as shown in FIG. 1A) and/or by interaction with the polysilicon on an upper portion of the STI structure 104 and a lower portion adjacent the semiconductor substrate 109 itself (e.g., as shown in FIG. 1B). The material 107 in the trench may, in a number of embodiments, be the $Al_2O_3$ dielectric. The semiconductor substrate of the STI structure 104 (and the semiconductor substrate 109) may be polysilicon formed outside the trench 106 relative to the memory device 102, 120 formed interior to the trench 106. The charged interface 108 may be formed by an aluminosilicate ($AlSiO_x$) being formed at the interface 108 (e.g., via a chemical reaction at the interface 108 between the $Al_2O_3$ 107 in the trench 106 and the polysilicon of the STI structure 104). For example, the $AlSiO_x$ may have a fixed negative charge with an electron density in a range of from around $1 \times 10^{11}$ to around $5 \times 10^{12}$ extra electrons (e.g., relative to a number of electrons that is substantially equal to a corresponding number of protons) per square centimeter at a uni-potential interface.

The charged interface 108 may, in a number of embodiments, raise the parasitic threshold of the STI structure 104 (e.g., a parasitic filed oxide threshold). For example, the raised parasitic threshold may increase an ability of the STI structure 104 to reduce (e.g., prevent or terminate) leakage of an electrical charge from the memory device 102, 120 (e.g., NAND, NOR, and/or NROM NVM devices, among other types of memory devices). The charged interface 108 may reduce (e.g., prevent or terminate) a rate of charge loss for the memory device. In a number of embodiments, the charged interface 108 may reduce (e.g., prevent or terminate) an edge fringing field intensity for the memory device.

As shown in FIGS. 1A and 1B, the memory device 102, 120 may have a polysilicon gate 111 (e.g., a control gate, an access gate, etc.) formed above the STI structure 104, which may, in a number of embodiments, be wider than opposite walls 119 of the trench 106. The semiconductor structure may include an extension layer of a composite of the polysilicon of the STI structure 104 and the $Al_2O_3$ dielectric layer 107 of the trench formed between the STI structure 104 and the polysilicon gate 111 that is formed wider than the opposite walls of the trench.

As shown in FIG. 1A, the semiconductor structure may, in a number of embodiments, include a high dielectric constant (k) dielectric layer 113 formed between the polysilicon gate 111 and the $Al_2O_3$ dielectric layer 107 of the extension layer. A middle portion of the high k dielectric layer 113 may extend into the channel between the walls 119 of the trench 106 a portion of a distance from the $Al_2O_3$ dielectric material 107 of the extension layer to the semiconductor substrate 109. The high k dielectric layer 113 may have a dielectric constant that is above 6.0. Examples of such high k dielectric materials that may be utilized (e.g., deposited) for formation of the high k dielectric layer include, but are not limited to, hafnium silicate (($HfO_2$)$_x$($SiO_2$)$_{1-x}$), hafnium dioxide ($HfO_2$), zirconium silicate (($ZrO_2$)$_x$($SiO_2$)$_{1-x}$), zirconium dioxide ($ZrO_2$), lanthanum oxide ($La_2O_3$), and aluminum oxide ($Al_2O_3$), among other high k dielectric materials.

As further shown in FIG. 1A, the semiconductor structure may, in a number of embodiments, include a floating gate 115 of the memory device 102 that may be formed under the high k dielectric layer 113 (e.g., the middle portion thereof) and between opposite walls of the trench 106 formed from the $Al_2O_3$ dielectric material 107. The floating gate 115 may include a floating node within floating gate 115, and the floating gate 115 may include and/or be surrounded by resistive material to isolate the floating node such that a charge contained in the floating node may remain unchanged over a period of time (e.g., by charge trapping for NVM). The floating gate 115 may be formed, for example, by a layer of aluminum oxide ($Al_2O_3$) between two layers of silicon oxynitride ($Si_2ON_2$), among other possible configurations for a floating gate. Direct tunneling (Fowler-Nordheim tunneling) and/or hot-carrier injection mechanisms may be utilized to modify an amount of charge stored in the floating gate 115.

As further shown in FIG. 1A, the semiconductor structure may, in a number of embodiments, include a tunnel layer 117 formed under the floating gate 115 and between the opposite walls of the trench 106 formed from the $Al_2O_3$ dielectric 107. The tunnel layer 117 may be formed, in a number of embodiments, from oxygen-rich silicon oxynitride (OR—SiON) (e.g., instead of or in addition to $SiO_2$). A polysilicon layer 118 may be formed as an extension of the polysilicon substrate 109 between the tunnel layer 117 and the polysilicon substrate 109.

As shown in FIG. 1B, the semiconductor structure may, in a number of embodiments, include a high k dielectric layer 113 formed under the polysilicon gate 111 and between opposite walls 119 of the trench 106 formed from the $Al_2O_3$ dielectric material 107. The polysilicon gate 111 may thus be positioned adjacent (e.g., contiguous) to the $Al_2O_3$ dielectric material 107 of an upper portion of the trench 106. A portion (e.g., a middle portion) of the polysilicon gate 111 may extend into the channel between the walls of the trench 106 a portion of a distance from an upper extension layer of the $Al_2O_3$ dielectric material 107 to a lower extension layer of the $Al_2O_3$ dielectric material 107 above the semiconductor substrate 109.

The semiconductor structure shown in FIG. 1B may, in a number of embodiments, further include a floating plate 123 formed from IN-SRN (e.g., instead of or in addition to Si or $SiO_2$) to provide the functionality of the floating gate 115 shown and described in connection with FIG. 1A. The floating plate 123 may be formed under the high k dielectric layer 113 and between opposite walls of the trench 106 formed from the $Al_2O_3$ dielectric material 107. A tunnel layer 117 may be formed under the floating plate 123 and between the opposite walls of the trench formed from the $Al_2O_3$ dielectric. For example, the tunnel layer 117 may be formed between the floating plate 123 and the extension 118 of the polysilicon substrate 109.

The semiconductor structure shown in FIG. 1B, may, in a number of embodiments, include a solid nitride layer (not shown) formed under the high k dielectric layer 113 and between opposite walls of the trench 106 formed from the $Al_2O_3$ dielectric material 107. The solid nitride layer may be formed, in a number of embodiments, from a nitride ion ($N^{3-}$) in combination with an element of similar or lower electronegativity. Examples of elements that may combine with $N^{3-}$ to form the solid nitride of the solid nitride layer include, but are not limited to, boron (B), Si, vanadium (V), titanium (Ti), and tantalum (Ta), among other elements.

FIGS. 2A and 2B each illustrate a cross-sectional view of a portion of an embodiment of a trench isolation interface structure 230 formed as a semiconductor structure. The semiconductor structure may, in a number of embodiments, include a polysilicon substrate 209 having an STI structure 204 with a trench 206 formed therein. A material 207 used to fill the trench 206 may be an $Al_2O_3$ dielectric layer 207 formed on a polysilicon surface of the STI structure 204. A composite of the $Al_2O_3$ dielectric layer 207 and the polysilicon of the STI structure 204 may form a trench isolation interface 208 in the trench 206 with a fixed negative charge by interaction in the trench 206 between the $Al_2O_3$ dielectric layer 207 and the polysilicon of the STI structure 204. The semiconductor structure may, in a number of embodiments, include an IN-SRN layer 240 formed on a surface of the trench 206 opposite from the STI structure 204 and adjacent the $Al_2O_3$ dielectric layer 207 at interface 208. In a number of embodiments, a $SiO_2$ dielectric layer (not shown) may be formed in the trench 206 on a surface of the STI structure 204 and the $Al_2O_3$ dielectric layer 207 may be formed upon the $SiO_2$ dielectric layer. A composite of the $SiO_2$ dielectric layer and the $Al_2O_3$ dielectric layer 207 may contribute to formation of the trench isolation interface 208 with the fixed negative charge.

In a number of embodiments, a memory device (e.g., memory device 232 in FIG. 2A and/or memory device 250 in FIG. 2B) may be included in the semiconductor structure. As described herein, the memory device 232, 250 may have a number of portions positioned interior to the STI structure 204 and adjacent the trench 206 and/or the IN-SRN layer 240. The IN-SRN layer 240 may contribute to confinement in a charge reservoir of charges in the memory device.

As described in connection with FIGS. 1A and 1B, the $Al_2O_3$ dielectric layer 207 in the trench 206 in FIGS. 2A and 2B may contribute to formation of a charged interface 208 by interaction with the polysilicon of the STI structure 204 (e.g., as shown in FIG. 2A) and/or by interaction with the polysilicon of an upper portion of the STI structure 204 and a lower portion adjacent the semiconductor substrate 209 itself (e.g., as shown in FIG. 2B). The semiconductor substrate of the STI structure 204 (and the semiconductor substrate 209) may be polysilicon formed outside the trench 206 relative to the memory device 232, 250 formed interior to the trench 206. As described in connection with FIGS. 1A and 1B, a uni-potential interface in FIGS. 2A and 2B may be formed by $AlSiO_x$ being formed at the interface 208 and the $AlSiO_x$ may have a fixed negative charge with an electron density in a range of from around $1\times10^{11}$ to around $5\times10^{12}$ extra electrons per square centimeter.

A composite of the polysilicon of the STI structure 204, the $Al_2O_3$ dielectric layer 207, and the IN-SRN layer 240 may, in a number of embodiments, form a completed interface (e.g., a composite isolation region including interfaces 208 and 239) that raises a parasitic threshold of the STI structure 204 (e.g., a parasitic filed oxide threshold). For example, the raised parasitic threshold may increase an ability of the STI structure 204 to reduce leakage of an electrical charge from the memory device 232, 250 (e.g., NAND, NOR, and/or NROM NVM devices, among other types of memory devices). The formed interface may reduce a rate of charge loss for the memory device. In a number of embodiments, the composite of the polysilicon of the STI structure 204, the $Al_2O_3$ dielectric layer 207, and the IN-SRN layer 240 may reduce an edge fringing field intensity for the memory device. In a number of embodiments described herein, the IN-SRN layers 240 may be formed adjacent (e.g., contiguous) to the STI structure 204 and the trenches 106 containing the $Al_2O_3$ dielectric material 207 may be formed on an outer surface thereof (e.g., adjacent the channel of the corresponding memory device).

The memory device 232, 250 may have an active region at least partially positioned interior to the STI structure 204 and adjacent the IN-SRN layer 240. A channel for the memory device 232, 250 may be at least partially positioned interior to the IN-SRN layer 240. The channel may have a width and/or a length 219 perpendicular to the IN-SRN layer 240 formed on a vertical surface of the trench 206. The length and/or width 219 of the channel may, in a number of embodiments, be in a range of from around twenty (20) nm to around five (5) nm.

The composite of the polysilicon of the STI structure 204, the $Al_2O_3$ dielectric layer 207, and the IN-SRN layer 240 may raise the parasitic threshold of the STI structure 204, reduce leakage of an electrical charge from the memory device 232, 250, and/or reduce an edge fringing field intensity for the memory device sufficient to improve operability of the memory devices having length and/or width 219 of the channel in the range of from around 20 nm to around 5 nm (e.g., relative to memory devices implemented in an STI configuration without the trench isolation interface structures 100, 230 described herein).

As shown in FIGS. 2A and 2B, the memory device 232, 250 may have a gate 234 (e.g., a control gate, an access gate, etc.) formed above the STI structure 204, which may, in a number of embodiments, be wider than opposite walls 219 of the trench 206 with the IN-SRN layer 240 formed thereon. The gate 234 may be formed from a metal (e.g., tungsten (W), aluminum (Al), among other possible metals). A metal may be utilized for the gate 234 (e.g., as opposed to the polysilicon described in connection with FIGS. 1A and 1B) in implementations of memory devices with relatively small length and/or width of the channel (e.g., in the range of from around 20 nm to around 5 nm) and/or memory devices in which a relatively high voltage threshold (Vt) and/or high k dielectric material is utilized (e.g., to contribute to reducing leakage of an electrical charge from the memory device 232, 250).

The metal gate 234 may, in a number of embodiments, be formed wider than opposite walls 219 of the trench 206. An extension layer of the $Al_2O_3$ dielectric layer 207 of the trench 206 and/or the IN-SRN layer 240 may be formed between the STI structure 204 and the metal gate 234 formed wider than the opposite walls of the trench.

In a number of embodiments, the semiconductor structure may include a tantalum nitride (TaN) layer 236 formed between the metal gate 234 and the opposite walls of the trench 206 having the IN-SRN layer 240 formed on the $Al_2O_3$ dielectric material 207. As shown in FIG. 2A, the TaN layer 236 may be positioned adjacent (e.g., contiguous) to the metal gate 234 straight across a length and/or width of the metal gate 234. As shown in FIG. 2B, the TaN layer 236 may be positioned adjacent to the metal gate 234 such that a portion (e.g., a middle portion) of the TaN layer 236 and/or the metal gate 234 extend into the channel between the walls 219 of the trench 206 a portion of a distance from the extension layer of the $Al_2O_3$ dielectric material 207 to the semiconductor substrate 209. By extending partially into the channel, the TaN layer 236 may replace the IN-SRN layer 240 from being formed on the $Al_2O_3$ dielectric material 207 in an upper portion of the channel.

The metal gate 234 and/or the TaN layer 236 may have a length and/or width that extends beyond the channel interior to the STI structure 204 (e.g., as shown by extending to the outer lines associated with the double-headed arrows 219 in FIGS. 2A and 2B). In a number of embodiments, the metal gate 234 may extend above a horizontal portion of a trench (e.g., upper portions of trench 206 filled with material 207 shown in FIGS. 2A and 2B) for the length and/or width above the STI structure 204.

As shown in FIG. 2A, the semiconductor structure may further include a high k dielectric layer 213, as described herein, formed between the TaN layer 236 and the opposite walls of the trench 206 having the IN-SRN layer 240 formed thereon and across a channel for the memory device 232 between the opposite walls. Another IN-SRN layer 238 may, in a number of embodiments, be formed between the TaN layer 236 and the high k dielectric layer 213. A floating gate 215 of the memory device 232 may be formed under the high k dielectric layer 213 (e.g., as shown at 113 and described in connection with FIG. 1A) and between opposite walls of the trench 216 having the IN-SRN layer 240 formed thereon and across a channel for the memory device 232 between the opposite walls. A tunnel layer 217 may be formed under the floating gate 215 and between the opposite walls of the trench having the IN-SRN layer 240 formed thereon. A polysilicon layer 218 may be formed between the tunnel layer 217 and the polysilicon substrate 209 (e.g., as an extension of the polysilicon substrate 209).

As shown in FIG. 2B, the semiconductor structure may further include a high k dielectric layer 213 formed under the TaN layer 236 and between the opposite walls of, in a number of embodiments, the upper portion of the trench not having the IN-SRN layer 240 formed thereon and across a channel for the memory device 250 between the opposite walls. A floating plate 223 (e.g., as shown at 123 and described in connection with FIG. 1B) may be formed from IN-SRN. The floating plate 223 may be formed under the high k dielectric layer 213 and between opposite walls of the portion of the trench not having the IN-SRN layer 240 formed thereon. A tunnel layer 217 may be formed under the floating plate 223 and between the opposite walls of a lower portion of the trench 216 having the IN-SRN layer 240 formed thereon. The tunnel layer 217 may be formed between the floating plate 223 and the polysilicon substrate 209. A polysilicon layer 218 may be formed between the tunnel layer 217 and the polysilicon substrate 209 (e.g., as an extension of the polysilicon substrate 209).

Embodiments described herein provide a method of forming a semiconductor structure including trench isolation interfaces. An example of such a method may include forming an STI structure 104, 204 in a polysilicon substrate material (e.g., the same material utilized to form the polysilicon substrate 109, 209). The method may include depositing a layer of $Al_2O_3$ dielectric 107, 207 on vertical and/or horizontal surfaces of the $Al_2O_3$ dielectric 107, 207 to form the trench 106, 206 between the STI structure 104, 204 and a memory device 102, 120, 232, 250. The method may include forming a trench isolation interface 108, 208 in the trench 106, 206 with a fixed negative charge by interaction of the polysilicon substrate material with the $Al_2O_3$ dielectric layer 107, 207, thereby raising a parasitic threshold of the STI structure 104, 204 and/or reducing an edge fringing field intensity for the memory device 102, 120, 232, 250.

The method may further include depositing a layer of IN-SRN 240 on the surface of the $Al_2O_3$ dielectric layer 207 opposite from interface 208 at interface 239. Alternatively and/or in addition, the method may further include depositing a layer of IN-SRN 240 on the surface of the STI structure 204 in the trench 206 prior to deposition of the $Al_2O_3$ dielectric layer 207 thereon. The method may further include annealing the $Al_2O_3$ dielectric layer 207 and/or the IN-SRN layer 240 after the deposition.

In a number of embodiments, annealing can be performed in an inert gas atmosphere (e.g., nitrogen, argon, helium and the like), which may or may not be mixed with oxygen. One example of an atmosphere employed in the annealing step of the present disclosure may include steam at a temperature about 600° Celsius (C) to about 700° C. for a time interval from about 30 to about 120 seconds. In another example, the atmosphere employed for the annealing step may be steam at a temperature from about 75° C. to about 600° C. for a time interval from about 30 to about 120 seconds. The annealing may be performed in a single ramp step or it can be performed using a series of ramp and soak cycles.

After annealing the $Al_2O_3$ dielectric layer 207 and/or the IN-SRN layer 240, the annealed semiconductor structure may then be subjected to suitable deposition and/or etch techniques that can be implemented to form the STI structure and memory device components described herein. The etching techniques may include, but are not limited to, dry etching techniques such as RIE, plasma etching, ion beam etching, and/or chemical dry etching, among others. Examples of suitable gases that can be employed in the dry etching process include but are not limited to, $CF_4$, $SF_6$, $NF_3$, $CHF_3$ and combinations thereof. The gases may also be used in conjunction with oxygen or an inert gas such as nitrogen or helium. Alternatively, an oxide etch may be implemented using a wet chemical etch process. Suitable chemical etchants that may be utilized include HF and $HNO_3$, among others. A buffered solution also may be utilized.

Additional processes can be performed using various techniques to complete an integrated circuit (IC) for use in an electronic system that includes a controller (e.g., a processor) and active semiconductor regions separated by the STI structure. Various types of devices can be formed. Such devices may include imaging devices, memory devices, and/or logic devices. For example, the completed IC can include an array of memory cells for an NVM or another type of memory device. In various ICs, logic devices for gate arrays, microprocessors, and/or digital signal processors may be formed. The STI structures described herein may separate the active regions from one another.

While example embodiments including various combinations and configurations of semiconductor structures for trench isolation interfaces have been illustrated and described herein, embodiments of the present disclosure are not limited to those combinations explicitly recited herein. Other combinations and configurations of the semiconductor structures for trench isolation interfaces disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor structure, comprising:
   an aluminum oxide ($Al_2O_3$) dielectric material on vertical and horizontal surfaces, of a shallow trench isolation (STI) structure in a silicon substrate material, that form a trench between the STI structure and a memory device;
   an interface in the trench having a fixed negative charge that is formed by interaction of the silicon substrate material with the $Al_2O_3$ dielectric and which raises a parasitic threshold of the STI structure; and
   a silicon oxide ($SiO_2$) dielectric material in the trench positioned on a surface of the STI structure, wherein the aluminum oxide ($Al_2O_3$) dielectric material is positioned on the $SiO_2$ dielectric material to have the interface with a fixed negative charge by interaction of the $SiO_2$ dielectric material with the $Al_2O_3$ dielectric material.

2. The semiconductor structure of claim 1, wherein the interface further reduces an edge fringing field intensity for the memory device.

3. The semiconductor structure of claim 1, further comprising an injector silicon-rich nitride (IN-SRN) material positioned on a surface of the $Al_2O_3$ dielectric material opposite from the interface.

4. The semiconductor structure of claim 1, further comprising an injector silicon-rich nitride (IN-SRN) material positioned on a surface of the STI structure in the trench under the $Al_2O_3$ dielectric material.

5. A semiconductor structure, comprising:
   a charged interface in a trench, of a shallow trench isolation (STI) structure in a semiconductor substrate, formed by interaction of a material with the semiconductor substrate of the STI structure;
   wherein the charged interface raises a parasitic threshold of the STI structure relative to an STI structure formed without the charged interface; and
   wherein the material in the trench is an aluminum oxide ($Al_2O_3$) dielectric material, the semiconductor substrate of the STI structure is a polycrystalline silicon material positioned outside the trench relative to a memory device positioned interior to the trench, and the charged interface is an aluminosilicate ($AlSiO_x$) material positioned at an interface between the polycrystalline silicon material of the STI structure and the $Al_2O_3$ dielectric material.

6. The semiconductor structure of claim 5, further comprising:
the memory device positioned interior to the trench of the STI structure and adjacent the trench;
wherein the charged interface further reduces an edge fringing field intensity for the memory device relative to the STI structure formed without the charged interface.

7. The semiconductor structure of claim 6, wherein the charged interface further reduces a rate of charge loss for the memory device.

8. The semiconductor structure of claim 5, wherein the AlSiO$_x$ material has a fixed negative charge with an electron density in a range of from around $1\times10^{11}$ to around $5\times10^{12}$ extra electrons per square centimeter at a uni-potential interface.

9. The semiconductor structure of claim 5, wherein:
the trench is positioned in a polycrystalline silicon substrate including the STI structure;
the charged interface includes the aluminum oxide (Al$_2$O$_3$) dielectric material in the trench positioned on a surface of the STI structure; and
the memory device has a portion positioned interior to the trench of the STI structure and adjacent the trench.

10. The semiconductor structure of claim 5, further comprising the aluminum oxide (Al$_2$O$_3$) dielectric material as the charged interface having a fixed negative charge by interaction with the polycrystalline silicon material as the semiconductor substrate.

11. The semiconductor structure of claim 5, further comprising:
a silicon oxide (SiO$_2$) dielectric material in the trench positioned on a surface of the STI structure; and
the aluminum oxide (Al$_2$O$_3$) dielectric material positioned on the SiO$_2$ dielectric material to have an interface with a fixed negative charge by interaction of the SiO$_2$ dielectric material with the Al$_2$O$_3$ dielectric material.

12. The semiconductor structure of claim 5, further comprising:
the memory device having a polysilicon gate above the STI structure and wider than opposite walls of the trench; and
an extension of the aluminum oxide (Al$_2$O$_3$) dielectric material of the trench between the STI structure and the polysilicon gate that is wider than the opposite walls of the trench.

13. The semiconductor structure of claim 5, further comprising:
a floating gate of a memory device positioned under a high k dielectric material and between opposite walls of the trench formed from the aluminum oxide (Al$_2$O$_3$) dielectric material; and
a tunnel layer under the floating gate and between the opposite walls of the trench.

14. The semiconductor structure of claim 5, further comprising:
a floating plate formed from an injector silicon-rich nitride material, wherein the floating plate is positioned under a high k dielectric material and between opposite walls of the trench formed from the aluminum oxide (Al$_2$O$_3$) dielectric material; and
a tunnel layer positioned under the floating plate and between the opposite walls of the trench, wherein the tunnel layer is between the floating plate and the semiconductor substrate.

* * * * *